US007872547B2

(12) United States Patent
Song et al.

(10) Patent No.: US 7,872,547 B2
(45) Date of Patent: Jan. 18, 2011

(54) WIRELESS COMMUNICATION DEVICE

(75) Inventors: Ai-Ning Song, Shenzhen (CN); Chong Xu, Shenzhen (CN); Qi-Jian Hu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 177 days.

(21) Appl. No.: 12/400,784

(22) Filed: Mar. 9, 2009

(65) Prior Publication Data

US 2010/0090777 A1 Apr. 15, 2010

(30) Foreign Application Priority Data

Oct. 10, 2008 (CN) ........................ 2008 1 0304887

(51) Int. Cl.
*H03H 7/46* (2006.01)
*H04B 1/44* (2006.01)
*H01P 1/10* (2006.01)

(52) U.S. Cl. .......................... 333/132; 333/101; 455/78

(58) Field of Classification Search ................. 333/101, 333/103, 104; 455/78
See application file for complete search history.

(56) References Cited

U.S. PATENT DOCUMENTS

| | | | | |
|---|---|---|---|---|
| 5,768,691 | A * | 6/1998 | Matero et al. | 455/78 |
| 6,978,121 | B1 | 12/2005 | Lane et al. | |
| 7,629,862 | B2 * | 12/2009 | Satoh et al. | 333/132 |
| 7,643,848 | B2 * | 1/2010 | Robinett | 455/552.1 |
| 7,656,251 | B1 * | 2/2010 | Bauder et al. | 333/133 |
| 7,773,956 | B2 * | 8/2010 | Fukamachi et al. | 455/78 |
| 2004/0005913 | A1 * | 1/2004 | Bollenbeck | 455/562.1 |
| 2009/0264086 | A1 * | 10/2009 | Song et al. | 455/90.2 |

* cited by examiner

*Primary Examiner*—Dean O Takaoka
(74) *Attorney, Agent, or Firm*—Frank R. Niranjan

(57) ABSTRACT

A wireless communication device includes an antenna module, a transceiving module, and a switch module. The antenna module includes a first antenna and a second antenna. The transceiving module includes a first transceiver and a second transceiver. The switch module switches different connections between the antenna module and the transceiving module, and includes a first single-pole-double-throw (SPDT) switch, a second SPDT switch, a third SPDT switch, a first duplexer, a second duplexer, and a double-pole-double-throw (DPDT) switch.

15 Claims, 1 Drawing Sheet

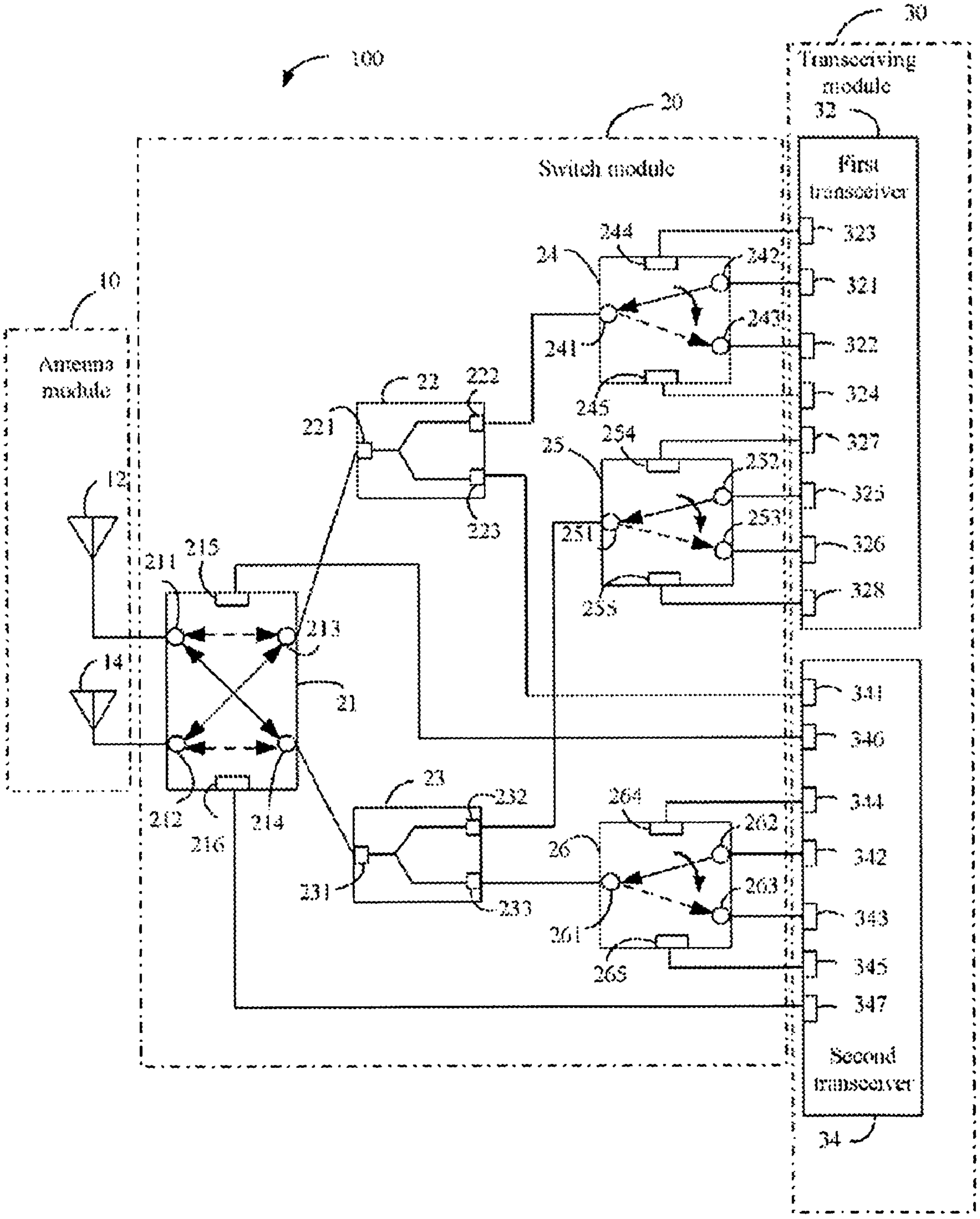
100
10
Antenna module
12
14
20
Switch module
21
211
212
213
214
215
216
22
221
222
223
23
231
232
233
24
241
242
243
244
245
25
251
252
253
254
255
26
261
262
263
264
265
30
Transceiving module
32
First transceiver
321
322
323
324
325
326
327
328
34
Second transceiver
341
342
343
344
345
346
347

WIRELESS COMMUNICATION DEVICE

BACKGROUND

1. Field of the Invention

Embodiments of the present disclosure relate to wireless communications, and more particularly to a wireless communication device.

2. Description of Related Art

With developments in wireless communication technology, increasing numbers of wireless communication devices support multiple bands. For example, a computer may support both wireless local area network (WLAN) and Worldwide Interoperability for Microwave Access (WiMAX) protocols. In addition, developments in technology regarding multiple antennas allow most of such wireless communication devices to have multiple antennas, thereby providing multiple signal transmission paths. However, it is difficult to achieve functional multiple signal transmission path activity in such wireless communication devices.

BRIEF DESCRIPTION OF THE DRAWINGS

The FIGURE is a schematic diagram of an embodiment of a wireless communication device according to the present disclosure.

DETAILED DESCRIPTION OF CERTAIN INVENTIVE EMBODIMENTS

A schematic diagram of an embodiment of a wireless communication device 100 is shown in the FIGURE. The wireless communication device 100 here may be a network adapter or mobile phone, supporting wireless local area network (WLAN) and worldwide interoperability for microwave access (WiMAX) capabilities. Here, a working frequency band of WLAN is 2.4 GHz and a working frequency band of WiMAX is 3.5 GHz. Alternatively, the wireless communication device 100 may be another device that supports other frequency bands.

The wireless communication device 100 here includes an antenna module 10, a switch module 20, and a transceiving module 30.

The antenna module 10 includes a first antenna 12 and a second antenna 14. Here, the first antenna 12 and the second antenna 14 respectively support WLAN and WiMAX, respectively working in frequency bands of 2.4 GHz and 3.5 GHz. Alternatively, the antenna module 10 may include antennas that work in other frequency bands.

The transceiving module 30 includes a first transceiver 32 and a second transceiver 34. Here, the first transceiver 32 may be a multiple input multiple output (MIMO) chipset that supports WLAN wireless communication. The first transceiver 32 comprises a first output 321, a first input 322, a first control terminal 323, a second control terminal 324, a second output 325, a second input 326, a third control terminal 327, and a fourth control terminal 328. The second transceiver 34 may be a multiple input single output (MISO) chipset that supports WiMAX wireless communication. The second transceiver 34 comprises a first input 341, an output 342, a second input 343, a first control terminal 344, a second control terminal 345, a third control terminal 346, and a fourth control terminal 347. Alternatively, the transceiving module 20 may comprise chipsets working in other frequency bands.

The switch module 20 is configured for switching different connections between the first antenna 12, the second antenna 14 and the first transceiver 32, the second transceiver 34. The switch module 20 comprises a double-pole-double-throw (DPDT) switch 21, a first duplexer 22, a second duplexer 23, a first single-pole-double-throw (SPDT) switch 24, a second SPDT switch 25, and a third SPDT switch 26. The DPDT switch 21 comprises a first terminal 211, a second terminal 212, a third terminal 213, a fourth terminal 214, a first control terminal 215, and a second control terminal 216. The first duplexer 22 comprises a common terminal 221, a first terminal 222, and a second terminal 223. The second duplexer 23 comprises a common terminal 231, a first terminal 232, and a second terminal 233. The first SPDT switch 24 comprises a common terminal 241, a first terminal 242, a second terminal 243, a first control terminal 244, and a second control terminal 245. The second SPDT switch 25 comprises a common terminal 251, a first terminal 252, a second terminal 253, a first control terminal 254, and a second control terminal 255. The third SPDT switch 26 comprises a common terminal 261, a first terminal 262, a second terminal 263, a first control terminal 264, and a second control terminal 265.

The first SPDT switch 24 connects the first transceiver 32 to the first duplexer 22. Here, the common terminal 241 of the first SPDT switch 24 is connected to the first terminal 222 of the first duplexer 22, the first terminal 242 of the first SPDT switch 24 is connected to the first output 321 of the first transceiver 32, and the second terminal 243 of the first SPDT switch 24 is connected to the first input 322 of the first transceiver 32.

The first control terminal 323 of the first transceiver 32 is connected to the first control terminal 244 of the first SPDT switch 24, and the second control terminal 324 of the first transceiver 32 is connected to the second control terminal 245 of the first SPDT switch 24, outputting a first control signal from the first transceiver 32 to the first SPDT switch 24 to connect the common terminal 241 and the first terminal 242 of the first SPDT switch 24 or connect the common terminal 241 and the second terminal 243 of the first SPDT switch 24.

In one example, the first control signal may comprise a high level signal from the first control terminal 323 and a low level signal from the second control terminal 324 generated by the first transceiver 32. In such a case, the common terminal 241 is connected to the first terminal 242 of the first SPDT switch 24.

In another example, the first control signal may comprise a low level signal from the first control terminal 323 and a high level signal from the second control terminal 324 generated by the first transceiver 32. In such a case, the common terminal 241 is connected to the second terminal 243 of the first SPDT switch 24.

The second SPDT switch 25 connects the first transceiver 32 to the second duplexer 23. Here, the common terminal 251 of the second SPDT switch 25 is connected to the first terminal 232 of the second duplexer 23, the first terminal 252 is connected to the second output 325 of the first transceiver 32, and the second terminal 253 of the second SPDT switch 25 is connected to the second input 326 of the first transceiver 32.

The third control terminal 327 of the first transceiver 32 is connected to the first control terminal 254 of the second SPDT switch 25, and the fourth control terminal 328 of the first transceiver 32 is connected to the second control terminal 255 of the second SPDT switch 25, outputting a second control signal from the first transceiver 32 to the second SPDT switch 25 to connect the common terminal 251 and the first terminal 252 of the second SPDT switch 25 or connect the common terminal 251 and the second terminal 253 of the second SPDT switch 25.

In one example, the second control signal may comprise a high level signal from the third control terminal 327 and a low level signal from the fourth control terminal 328 generated by the first transceiver 32. In such a case, the common terminal 251 is connected to the first terminal 252 of the second SPDT switch 25.

In another example, the first control signal may comprise a low level signal from the third control terminal 327 and a high level signal from the fourth control terminal 328 generated by the first transceiver 32. In such a case, the common terminal 251 is connected to the second terminal 253 of the second SPDT switch 25.

The third SPDT switch 26 connects the second transceiver 34 to the second duplexer 23. Here, the common terminal 261 of the third SPDT switch 26 is connected to the second terminal 233 of the second duplexer 23, the first terminal 262 is connected to the output 342 of the second transceiver 34, and the second terminal 263 is connected to the second input 343 of the second transceiver 34.

The first control terminal 344 of the second transceiver 34 is connected to the first control terminal 264 of the third SPDT switch 26, and the second control terminal 345 of the second transceiver 34 is connected to the second control terminal 265 of the third SPDT switch 26, outputting a third control signal from the second transceiver 34 to the third SPDT switch 26 to connect the common terminal 261 and the first terminal 262 of the third SPDT switch 26 or connect the common terminal 261 and the second terminal 263 of the third SPDT switch 26.

In one example, the third control signal may comprise a high level signal from the first control terminal 344 and a low level signal from the second control terminal 345 generated by the second transceiver 34. In such a case, the common terminal 261 is connected to the first terminal 262 of the third SPDT switch 26.

In another example, the third control signal may comprise a low level signal from the first control terminal 344 and a high level signal from the second control terminal 345 generated by the second transceiver 34. In such a case, the common terminal 261 is connected to the second terminal 263 of the third SPDT switch 26.

The first duplexer 22 separates different frequency bands. Here, the common terminal 221 of the first duplexer 22 is connected to the DPDT switch 21, receiving RF signals from the antenna module 10 through the DPDT switch 21, wherein the RF signals comprise a low frequency band signal of 2.4 GHz and a high frequency band signal of 3.5 GHz. Here, the first terminal 222 and the second terminal 223 of the first duplexer 22 transmit the low frequency band signal of 2.4 GHz and the high frequency band signal of 3.5 GHz to the transceiving module 30, respectively. Alternatively, the first duplexer 22 separates other frequency bands.

Here, the first terminal 222 of the first duplexer 22 is connected to the common terminal 241 of the first SPDT switch 24, transmitting the low frequency band signal of 2.4 GHz to the first transceiver 32 through the first SPDT switch 24. The second terminal 223 of the first duplexer 22 is connected to the first input 341 of the second transceiver 34, transmitting the high frequency band signal of 3.5 GHz to the second transceiver 34.

The second duplexer 23 separates different frequency bands. Here, the common terminal 231 of the second duplexer 23 is connected to the DPDT switch 21, receiving RF signals from the antenna module 10 through the DPDT switch 21, wherein the RF signals comprise a low frequency band signal of 2.4 GHz and a high frequency band signal of 3.5 GHz. Here, the first terminal 232 and the second terminal 233 of the second duplexer 23 transmit the low frequency band signal of 2.4 GHz and the high frequency band signal of 3.5 GHz, respectively. Alternatively, the second duplexer 23 can separate other frequency bands.

Here, the first terminal 232 of the second duplexer 23 is connected to the common terminal 251 of the second SPDT switch 25, transmitting the low frequency band signal of 2.4 GHz to the first transceiver 32 through the second SPDT switch 25. The second terminal 233 of the second duplexer 23 is connected to the common terminal 261 of the third SPDT switch 26, transmitting the high frequency band signal of 3.5 GHz to the second transceiver 34 through the third SPDT switch 26.

The DPDT switch 21 is connected among the first duplexer 22, the second duplexer 23, and the antenna module 10. Here, the first terminal 211 is connected to the first antenna 12, the second terminal 212 is connected to the second antenna 14, the third terminal 213 is connected to the common terminal 221 of the first duplexer 22, and the fourth terminal 214 is connected to the common terminal 231 of the second duplexer 23.

The third control terminal 346 of the second transceiver 34 is connected to the first control terminal 215 of the DPDT switch 21, and the fourth control terminal 347 of the second transceiver 34 is connected to the second control terminal 216 of the DPDT switch 21, outputting a fourth control signal from the second transceiver 34 to the DPDT switch 21 to connect the first terminal 211 and the third terminal 213 and connect the second terminal 212 and the fourth terminal 214 of the DPDT switch 21, or connect the first terminal 211 and the fourth terminal 214 and connect the second terminal 212 and the third terminal 213 of the DPDT switch 21.

In one example, the fourth control signal may comprise a high level signal from the third control terminal 346 and a low level signal from the fourth control terminal 347 generated by of the second transceiver 34. In such a case, the first terminal 211 is connected to the fourth terminal 214, and the second terminal 12 is connected to the third terminal 213.

In another example, the fourth control signal may comprise a low level signal from the third control terminal 346 and a high level signal from the third control terminal 347 generated by the second transceiver 34. In such a case, the first terminal 211 is connected to the third terminal 213, and the second terminal 212 is connected to the fourth terminal 214.

Here, the second transceiver 34 has a priority to choose the better performing antenna from the first antenna 12 and the second antenna 14 by generating the fourth control signal to the DPDT switch 21. Accordingly, the first transceiver 32 selects the remaining antenna because the second transceiver 34 corresponds with the first transceiver 32.

It should be noted that the wireless communication device 100 of the disclosure is not limited to the schematic diagram of the FIGURE, wherein each feature or element can be changed within the principles of the present disclosure. For example, the wireless communication device 100 can further comprise a control module to execute the control functions of the first transceiver 32. The first transceiver 32 can also have the priority to select the better performing antenna from the first antenna 12 and the second antenna 14. High and low level signals of the control signals generated by the first transceiver 32 and the second transceiver 34 can also be exchanged according to different requirements. It may be understood that the SPDT switches 24, 25, 26 and the DPDT switch 21 may be cut off if their first and second control terminals both receive a high level signal or both receive a low level signal.

The wireless communication device 100 switches connections between the plurality of antennas 12 and 14 of the antenna module 10 and the plurality of transceivers 32 and 34 of the transceiving module 30 via the switch module 20. Therefore, there are multiple signal transmission paths coexisting in the wireless communication device 100, which allows the wireless communication device 100 to operate under multiple frequency bands. In addition, the second transceiver 34 can select one antenna that has a better signal from the first antenna 12 and the second antenna 14 via the DPDT switch 21.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A wireless communication device, comprising:

an antenna module comprising a first antenna and a second antenna;

a transceiving module comprising a first transceiver and a second transceiver; and a switch module configured for switching different connections between the first antenna, the second antenna and the first transceiver, the second transceiver, the switch module comprising:

a first single-pole-double-throw (SPDT) switch comprising a first terminal, a second terminal, and a common terminal, the first terminal and the second terminal of the first SPDT switch being connected to the first transceiver;

a second SPDT switch comprising a first terminal, a second terminal, and a common terminal, the first terminal and the second terminal of the second SPDT switch being connected to the first transceiver;

a third SPDT switch comprising a first terminal, a second terminal, and a common terminal, the first terminal and the second terminal of the third SPDT switch being connected to the second transceiver;

a first duplexer comprising a first terminal, a second terminal, and a common terminal, the first terminal of the first duplexer being connected to the common terminal of the first SPDT switch, the second terminal of the first duplexer being connected to the second transceiver;

a second duplexer comprising a first terminal, a second terminal, and a common terminal, the first terminal of the second duplexer being connected to the common terminal of the second SPDT switch, the second terminal of the second duplexer being connected to the common terminal of the third SPDT switch; and a double-pole-double-throw (DPDT) switch comprising a first terminal connected to the first antenna, a second terminal connected to the second antenna, a third terminal connected to the common terminal of the first duplexer, and a fourth terminal connected to the common terminal of the second duplexer.

2. The wireless communication device as claimed in claim 1, wherein the first transceiver comprises a first output connected to the first terminal of the first SPDT switch and a first input connected to the second terminal of the first SPDT switch.

3. The wireless communication device as claimed in claim 2, wherein the first SPDT switch further comprises a first control terminal and a second control terminal.

4. The wireless communication device as claimed in claim 3, wherein the first transceiver further comprises a first control terminal and a second control terminal respectively connected to the first control terminal and the second control terminal of the first SPDT switch, outputting a first control signal from the first transceiver to the first SPDT switch to connect the common terminal of the first SPDT switch selectively to the first terminal or the second terminal of the first SPDT switch.

5. The wireless communication device as claimed in claim 3, wherein the first transceiver further comprises a second output connected to the first terminal of the second SPDT switch and a second input connected to the second terminal of the second SPDT switch.

6. The wireless communication device as claimed in claim 5, wherein the second SPDT switch further comprises a first control terminal and a second control terminal.

7. The wireless communication device as claimed in claim 6, wherein the first transceiver further comprises a third control terminal and a fourth control terminal respectively connected to the first control terminal and the second control terminal of the second SPDT switch, outputting a second control signal from the first transceiver to the second SPDT switch to connect the common terminal of the second SPDT switch selectively to the first terminal or the second terminal of the second SPDT switch.

8. The wireless communication device as claimed in claim 1, wherein the second transceiver comprises a first input connected to the second terminal of the first duplexer, a second input connected to the second terminal of the third SPDT switch, and an output connected to the first terminal of the third SPDT switch.

9. The wireless communication device as claimed in claim 8, wherein the third SPDT switch further comprises a first control terminal and a second control terminal.

10. The wireless communication device as claimed in claim 9, wherein the second transceiver further comprises a first control terminal and a second control terminal respectively connected to the first control terminal and the second control terminal of the third SPDT switch, outputting a third control signal from the second transceiver to the third SPDT switch to connect the common terminal of the third SPDT switch selectively to the first terminal or the second terminal of the third SPDT switch.

11. The wireless communication device as claimed in claim 10, wherein the DPDT switch further comprises a first control terminal and a second control terminal.

12. The wireless communication device as claimed in claim 11, wherein the second transceiver further comprises a third control terminal and a fourth control terminal respectively connected to the first control terminal and the second control terminal of the DPDT switch, outputting a fourth control signal from the second transceiver to the DPDT switch to connect the first terminal and the third terminal, and connect the second terminal and the fourth terminal of the DPDT switch, or connect the first terminal and the fourth terminal, and connect the second terminal and the third terminal of the DPDT switch.

13. A wireless communication device, comprising:

an antenna module comprising a plurality of antennas;

a transceiving module comprising a plurality of transceivers; and a switch module configured for switching connections between one or more of the plurality of antennas and one or more of the plurality of transceivers, the switch module comprising:

a plurality of single-pole-double-throw (SPDT) switches each comprising a first terminal and a second terminal respectively connected to one of the transceivers;

a plurality of duplexers each comprising a common terminal, a first terminal, and a second terminal, one of the first terminal and the second terminal of each duplexer being connected to a common terminal of one of the plurality of SPDT switches; and a double-pole-double-throw (DPDT) switch comprising a first terminal connected to one of the plurality of the antennas, a second terminal connected to another of the plurality of antennas, a third terminal connected to a common terminal of one of the plurality of the duplexers, and a fourth terminal connected to a common terminal of another of the plurality of duplexers.

14. The wireless communication device as claimed in claim 13, wherein the DPDT switch is controlled by a control signal generated by one of the plurality of the transceivers that connects to the DPDT switch.

15. The wireless communication device as claimed in claim 13, wherein the SPDT switches are controlled by corresponding transceivers connected thereto to selectively switch the connections between the common terminal and the first terminal or the second terminal thereof.

* * * * *